(12) United States Patent
Jackson et al.

(10) Patent No.: US 7,574,336 B1
(45) Date of Patent: Aug. 11, 2009

(54) MODEL WORKSPACES IN MODELING ENVIRONMENTS

(75) Inventors: Paul Jackson, Wellesley, MA (US); Sanjai Singh, Bangalore (IN); Ramamurthy Mani, Needham, MA (US)

(73) Assignee: The MathWorks, Inc., Natick, MA (US)

( * ) Notice: Subject to any disclaimer, the term of this patent is extended or adjusted under 35 U.S.C. 154(b) by 469 days.

(21) Appl. No.: 10/959,612

(22) Filed: Oct. 5, 2004

(51) Int. Cl.
  *G06F 7/60* (2006.01)
  *G06F 17/10* (2006.01)

(52) U.S. Cl. .............................. 703/2; 715/763; 715/764

(58) Field of Classification Search ...................... 703/2, 703/22
See application file for complete search history.

(56) References Cited

U.S. PATENT DOCUMENTS

| | | | |
|---|---|---|---|
| 6,643,555 B1 * | 11/2003 | Eller et al. ..................... | 700/83 |
| 6,983,227 B1 * | 1/2006 | Thalhammer-Reyero ....... | 703/2 |
| 2004/0215441 A1 * | 10/2004 | Orofino et al. ................ | 703/22 |
| 2005/0278162 A1 * | 12/2005 | Ciolfi et al. ................... | 703/22 |
| 2006/0212284 A1 * | 9/2006 | Orofino et al. ................ | 703/22 |

OTHER PUBLICATIONS

The MathWorks, Inc., Using Simulink®. Version 3. © 1990-1999. pp. i-xiii, 1-2 to 1-3, 3-28, 3-40, 3-42 to 3-43, 3-47, 4-4 to 4-5, 4-17 to 4-23, 5-2 to 5-3, and 8-85 to 8-87.*
The MathWorks, Inc., Getting Started with MATLAB®. Version 5. © 1984-1998. pp. i-iii and pp. 38 to 41.*
The MathWorks, Inc., STATEFLOW® for Use with SIMULINK® User's Guide. Version 2. © 1997-1999. pp. i-vi, p. 5, p. 6, and p. 4-24.*
The MathWorks, Inc., Using MATLAB®. Version 5. © 1984-1999, pp. i-viii and pp. 2-10 to 2-14.*
Papandreou, N. et al., "Transmission Systems Prototyping Based on Stateflow/Simulink Models." 15th IEEE Int'l Workshop on Rapid Systems Prototyping. Jun. 28-30, 2004. pp. 174-179.*

* cited by examiner

*Primary Examiner*—Kidest Bahta
*Assistant Examiner*—Mary C Jacob
(74) *Attorney, Agent, or Firm*—Lahive & Cockfield, LLP; Kevin J. Canning (57) ABSTRACT

A model workspace that has a close relationship with a model is disclosed. The model workspace may contain data associated with the model, such as data defining data types and values of variables in the model. The data in the model workspace are visible in the scope of the model. The model workspace may be initialized from a data repository including a plurality of data sources. The data sources may include persistent data sources, such as a model file, an external data file and a computer program, and interfaces, such as command line interfaces and graphical user interfaces. The model workspace can be reinitialized from different data sources and can be stored into different data sources.

47 Claims, 8 Drawing Sheets

MODEL WORKSPACES IN MODELING ENVIRONMENTS

FIELD OF THE INVENTION

The present invention relates generally to modeling environments and more particularly to a model workspace in the modeling environments.

BACKGROUND OF THE INVENTION

Simulink® from The MathWorks, Inc. of Natick, Mass., is a platform for multi-domain simulation and model-based design of dynamic systems. Simulink® provides an interactive graphical environment and a customizable set of block libraries that enable users to accurately design, simulate, implement, and test control, signal processing, communications, and other time-varying systems. Stateflow® from The MathWorks, Inc. of Natick, Mass., is an interactive design and simulation tool for event-driven systems. Stateflow® provides the language elements required to describe complex logic in a natural, readable, and understandable form. Stateflow® is integrated with Simulink®, providing an efficient environment for designing embedded systems that contain control, supervisory, and mode logic.

Simulink® and Stateflow® are designed to operate on the foundation of MATAB® from The MathWorks, Inc. of Natick, Mass., which provides a technical computing environment. The technical computing environment provides a MATLAB® workspace consisting of the set of variables (named arrays) built up during a MATLAB® session and stored in memory. For example, if users type:

t=0:pi/4:2*pi; and
y=sin(t), the MATLAB® workspace includes two variables, y and t, each having nine values.

A Simulink® model, defines its variables with various types and values of data. In Simulink®, which operates on the foundation of MATLAB®, the data associated with the variables of a block diagram model is stored in the MATLAB® workspace. Because the MATLAB® workspace is a global workspace that can contain data associated with other Simulink® models loaded in the modeling environment, the relationship between the block diagram model and the MATLAB® workspace is very loose.

In the conventional block diagram modeling environment, the loose relationship between a block diagram model and a global workspace makes it inefficient for the block diagram model to access and manipulate the data contained in the global workspace. Because the global workspace contains data associated with the entire block diagram modeling environment, it takes time to search data associated with a particular block diagram model. Therefore, it is desired to provide a workspace that has a closer relationship with a block diagram model to make it efficient for the block diagram model to access and manipulate the data contained in the workspace. In addition, it is needed that the model workspace enables the user to limit the scope/visibility of data such that certain data is only visible within the model in question and is not visible to other models within the block diagram modeling environment.

SUMMARY OF THE INVENTION

The present invention provides for a model workspace that has a close relationship with a model in a modeling environment. The model workspace may contain data associated with the model. For example, the model workspace may contain data objects that define data types and values of variables in the model. The model workspace may be initialized from a data repository including a plurality of data sources. The data sources may include persistent data sources, such as a model file, an external data file, a computer program, etc., and interfaces, such as command line interfaces, graphical user interfaces, etc. The model workspace may be reinitialized from different data sources and can be stored into different data sources. The close relationship between the model and the model workspace makes it efficient for the model to access and manipulate the data in the model workspace.

In one aspect of the present invention, a method is provided for controlling data associated with a model in a modeling environment. A model workspace is provided for the model. The data associated with the model can be stored in the model workspace for the model.

In another aspect of the present invention, a system is provided for controlling data associated with a model in a modeling environment. The system includes a model workspace for containing the data associated with the model. The system also includes at least one data source for providing the model workspace with the data associated with the model. In another embodiment of the present invention, it is possible for the model workspace to have zero data sources.

In another aspect of the present invention, a method is provided for controlling a plurality of data sources for a model in a modeling environment. A first user interface element is provided for displaying entities of a model, the entities including a model workspace for containing data of the model. In response to the users' selection of the model workspace in the first user interface element, a second user interface element is displayed for providing an option for selecting a data source to initialize the model workspace.

In another aspect of the present invention, a computer program product holding instructions executable in a computer is provided for controlling data associated with a model in a modeling environment. A model workspace is provided for the model. The data associate with the model is stored in the model workspace for the model.

In another aspect of the present invention, a computer program product holding instructions executable in a computer is provided for executing a method for controlling a plurality of data sources for a model in a modeling environment. A first user interface element is provided for displaying entities of a model, the entities including a model workspace for containing data of the model. In response to the users' selection of the model workspace in the first user interface element, a second user interface element is displayed for providing an option for selecting a data source to initialize the model workspace.

BRIEF DESCRIPTION OF THE DRAWINGS

The aforementioned features and advantages, and other features and aspects of the present invention, will become better understood with regard to the following description and accompanying drawings, wherein.

DETAILED DESCRIPTION

The illustrative embodiment of the present invention provides for a model workspace that is configured to maintain a close relationship with a block diagram model in a block diagram modeling environment. A workspace generally refers to a virtual data container for storing information/data. For the description of the illustrative embodiment, a model workspace refers to an entity containing data objects associated with the block diagram model. The model workspace exists independently from the block diagram model and has an explicit association with the block diagram model. The data objects contained in the model workspace may include data defining the types and values of variables in the block diagram model. Those skilled in the art will appreciate that the data objects contained in the model workspace may also include other data, such as the data defining the signals and/or states in the block diagram model. The contents of model workspace can be accessed and/or modified via the workspace's programmatic and graphical user interfaces.

The block diagram model may own its own model workspace. The workspace and its contents can be accessed and/or modified by this model. The workspace and its contents can also be accessed and/or modified via the model's programmatic and graphical user interfaces. The data objects contained in a model workspace are visible only in the scope of the block diagram model that owns the model workspace. If users load two or more block diagram models in the block diagram modeling environment, multiple model workspaces are provided in the block diagram modeling environment and each of the model workspaces is associated with the block diagram model that owns the model workspace. The data objects associated with a particular block diagram model can be accessed by the particular block diagram model and cannot be accessed by other block diagram models.

The illustrative embodiment provides a plurality of data sources from which the model workspace may be initialized. The data sources include, for example, persistent data sources and interfaces. The persistent data sources may include a model file where a block diagram model is stored. The data for initializing the model workspace is stored as a part of the model file. The persistent data sources may also include external data files, which can be textual or binary code. The persistent data sources may further include computer programs executed to initialize the model workspace. The interfaces may include command line interfaces and graphical user interfaces. The interface enables users to load and modify data in the model workspace, and to execute the persistent data sources to initialize the model workspace. Using the interfaces, the model workspace can be reinitialized from other data sources. Also, the data in the model workspace can be stored into other data sources.

The illustrative embodiment will be described solely for illustrative purposes relative to a block diagram modeling environment. The block diagram modeling environment may include a time-based block diagram modeling environment, a state-based and flow diagram modeling environment and data flow modeling environment. Those of skill in the art will appreciate that the present invention may apply to other modeling environments, such as textual modeling environments and command line modeling environments.

Figure 1:
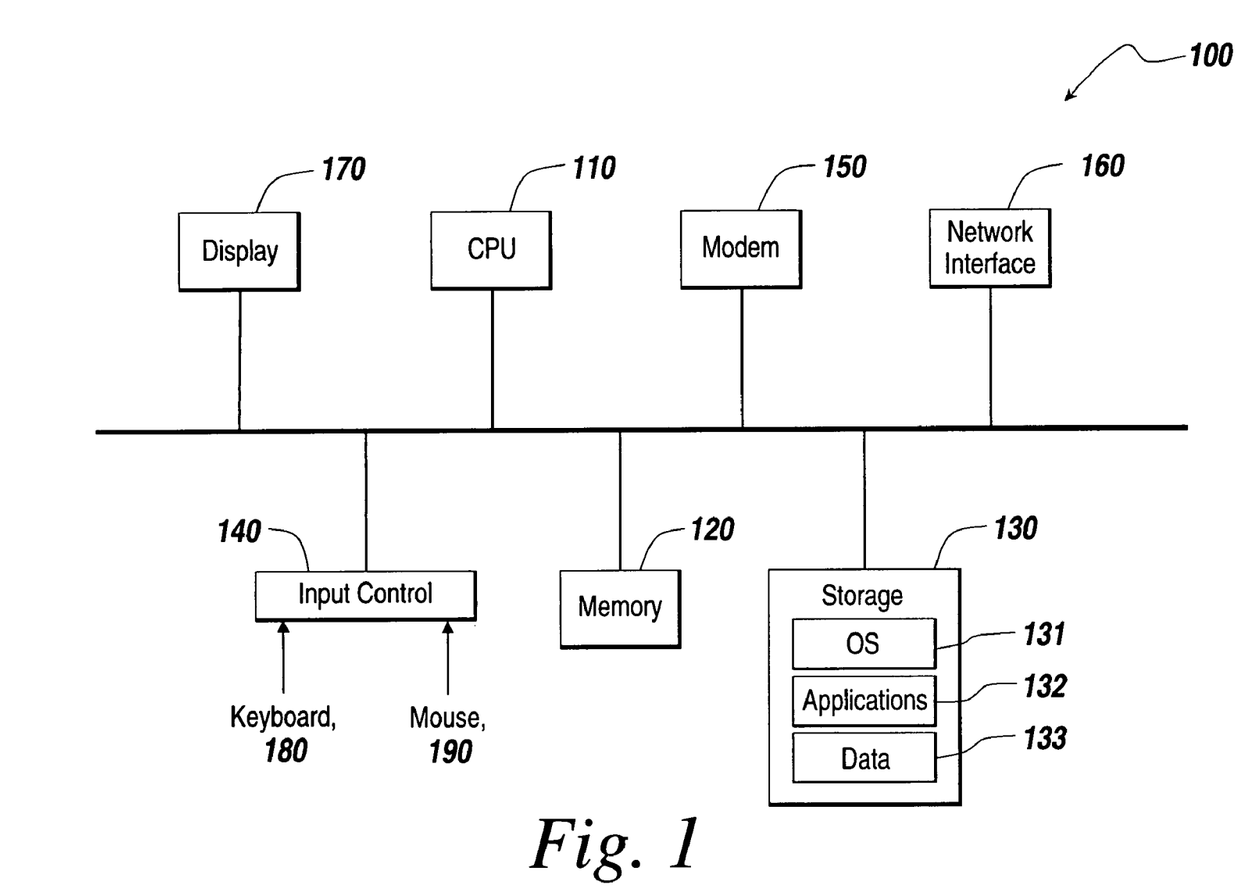
FIG. 1 is an exemplary electronic device suitable for practicing the illustrative embodiment of the present invention.

FIG. 1 is an exemplary electronic device 100 suitable for practicing the illustrative embodiment of the present invention, which provides a block diagram modeling environment. The electronic device 100 may take many forms, including but not limited to a workstation, server, network computer, Internet appliance, mobile device, a pager, a tablet computer, and the like. One of ordinary skill in the art will appreciate that the electronic device 100 is intended to be illustrative and not limiting of the present invention.

The electronic device 100 may include a Central Processing Unit (CPU) 110, memory 120, storage 130, an input control 140, a network interface 160, a MODEM 150, a display 170, etc. The input control 140 may interface with a keyboard 180, a mouse 190, and other input devices. The electronic device 100 may receive through the input control 140 input data necessary for initializing a model workspace, modifying data objects in the model workspace and saving the data objects into data sources, such as a model file and an external data file. The electronic device 100 may display in the display 170 the data objects populated in the model workspace. The network interface 160 and the MODEM 150 enable the electronic device 100 to communicate with other electronic devices through communication networks, such as Internet, intranet, LAN (Local Area Network), WAN (Wide Area Network) and MAN (Metropolitan Area Network). The communication facilities may support for the distributed implementations of the present invention.

The CPU 110 controls each component of the electronic device 100 to provide the block diagram modeling environment. The memory 120 fetches from the storage 130 and provides to the CPU 110 code that needs to be accessed by the CPU 110 to operate the electronic device 100 and to run the block diagram modeling environment. The storage 130 usually contains software tools for applications. The storage 130 includes, in particular, code 131 for the operating system (OS) of the device 100, code 132 for applications running on the operation system, such as applications for providing the block diagram modeling environment, and data 133 used or generated in the device 100, such as the data for block diagram models generated in the block diagram modeling environment.

An exemplary block diagram modeling environment may be found in Simulink® from The MathWorks, Inc. Simulink® provides tools for modeling and simulating a variety of dynamic systems in one integrated, graphical environment. Simulink® enables users to design a block diagram for a target system, simulate the system's behavior, analyze the performance of the system, and refine the design of the system. Simulink® allows users to design target systems through a user interface that allows drafting of block diagram models of the target systems. All of the blocks in a block library provided by Simulink and other programs are available to users when the users are building the block diagram of the target systems. Individual users may be able to customize this model block to: (a) reorganize blocks in some custom format, (b) delete blocks they do not use, and (c) add custom blocks they have designed. The blocks may be dragged through some human-machine interface (such as a mouse or keyboard) from the block library on to the window (i.e., model canvas). Simulink® includes a block diagram editor that allows users to perform such actions as draw, edit, annotate, save, and print out block diagram representations of target systems. The block diagram editor is a graphical user interface (GUI) component that allows drafting of block diagram models by users. In Simulink®, there is also a textual interface with a set of commands that allow interaction with the graphical editor, such as the textual interface provided in MATLAB®. Using this textual interface, users may write special scripts that perform automatic editing operations on the block diagram. Simulink® also allows users to simulate the designed target systems to determine the behavior of the systems. Simulink® includes a block diagram execution engine that carries out the task of compiling and linking the block diagram to produce an "in-memory executable" version of the model that is used for generating code and/or simulating a block diagram model.

Figure 2:
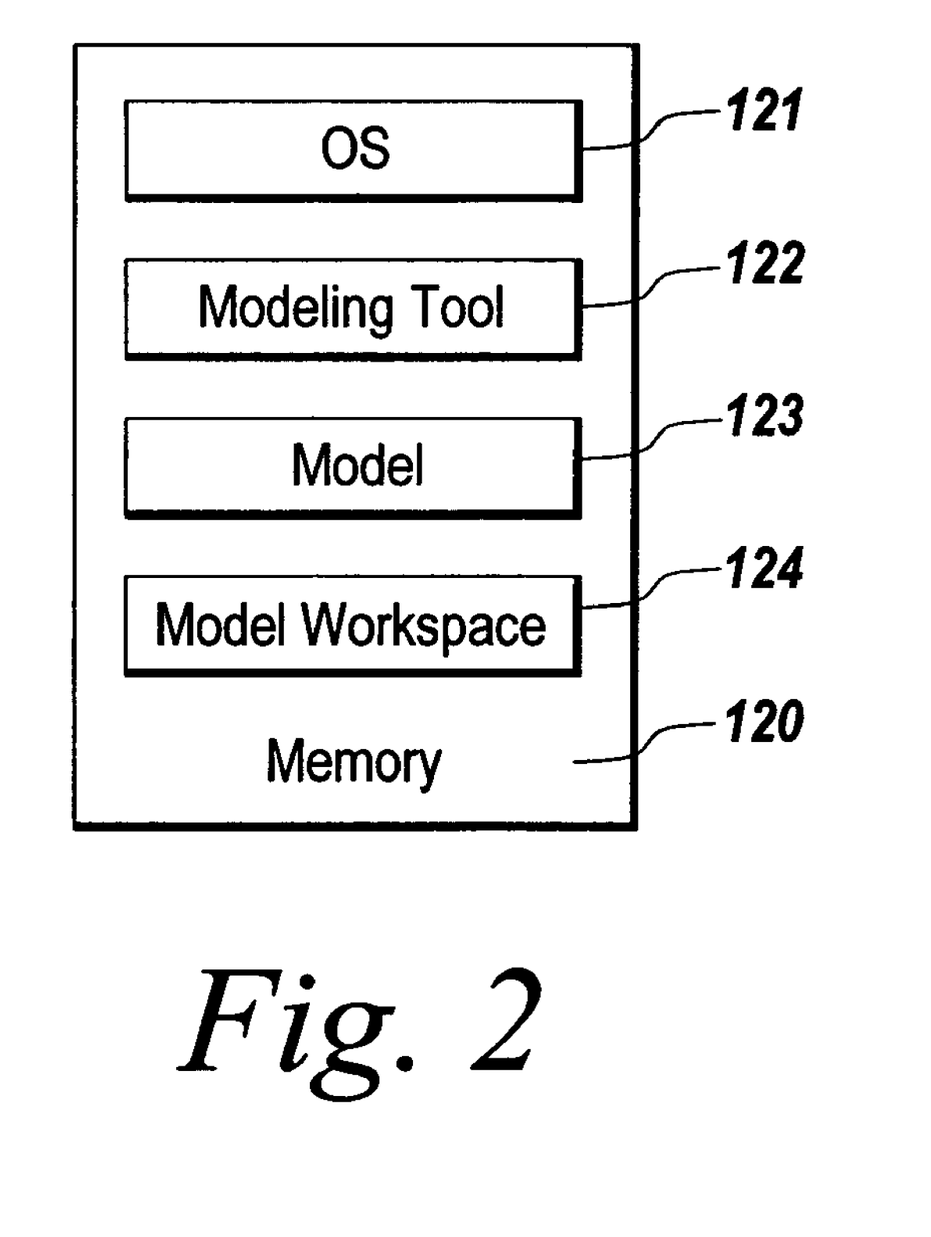
FIG. 2 depicts an exemplary configuration of memory in the illustrative embodiment of the present invention.

FIG. 2 depicts an exemplary configuration of the memory 120 in the illustrative embodiment of the present invention. The memory 120 is generally initialized and loaded with an operating system (OS) 121 at a boot process. The operating system 121 performs the allocation and usage of hardware resources, such as the memory 120, CPU 110 time, and storage 130 space. The operating system 121 is the foundation on which the modeling tool 122 is built up to provide a block diagram modeling environment. Those skilled in the art will appreciate that the memory 120 may also contain additional items that are not explicitly labeled in FIG. 2. If the users load a block diagram model 123 in the block diagram modeling environment, a model workspace 124 is created in the memory 120 to contain data objects associated with the block diagram model. The model workspace 124 is described below in more detail with reference to FIG. 3.

Figure 3:
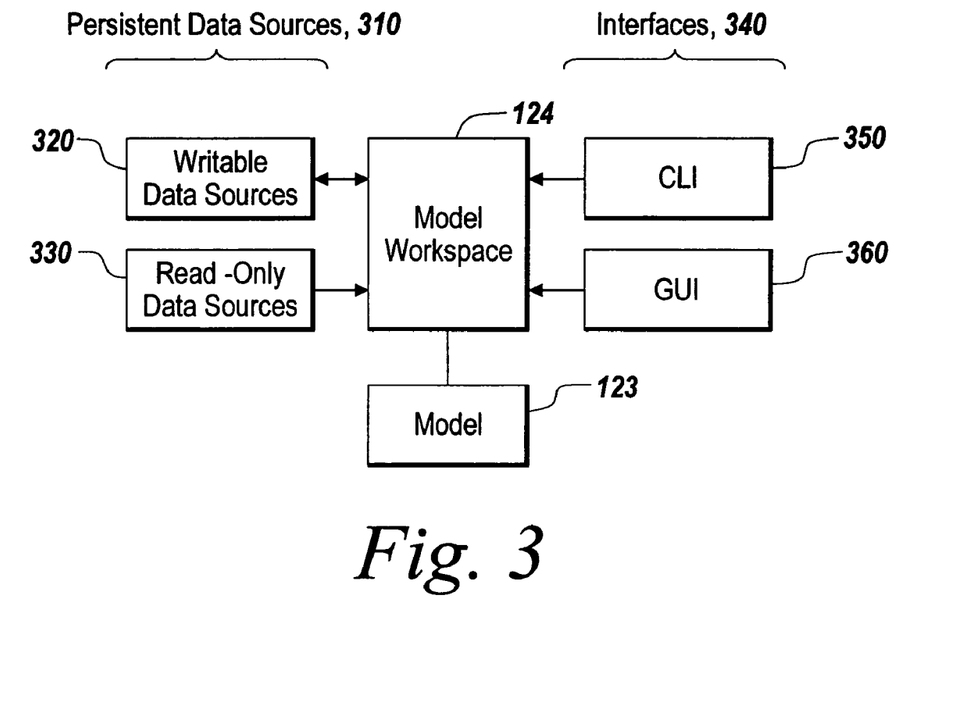
FIG. 3 depicts a plurality of data sources for populating data objects in the model workspace, modifying the data objects in the model workspace, and saving the data objects into data sources.

FIG. 3 depicts a plurality of data sources for populating data objects in the model workspace 124, modifying the data objects in the model workspace 124, and saving the data objects into data sources. The data sources may include persistent data sources 310 and interfaces 340. The persistent data sources 310 may provide the same data objects for the model workspace until the persistent data sources 310 are changed by users. The interfaces 340 enable the users to interact with the model workspace and its contents to create or modify data objects in the model workspace. The persistent data sources 310 may include writable data sources 320 and read-only data sources 330. An example of the writable data sources 320 may include a model file. In the case of the model file, the data objects in the model workspace are saved in the model file when the model is saved in the model file. In Simulink®, the model file has an extension .mdl and is called an MDL-file. Another example of the writable data sources 320 can be found in external data files, such as MATLAB® MAT-files. The MAT-file is a binary disc file that has the extension of mat. The MAT-files may contain one or more of data types supported in MATLAB®, including strings, matrices, multidimensional arrays, structures, and cell arrays. The data is sequentially written onto disk as a continuous byte stream. One of skill in the art will appreciate that the MAT-files are illustrative external data files and the external data files may include other types of files, such as text data files. An example of the read-only data sources 330 may include computer programs, such as MATLAB® M-code, that can be executed to initialize model workspace. The MATLAB® M-code is an illustrative computer programs for the read-only data sources and the read-only data sources may include computer programs written in other languages, such as C, C++, Java, etc. One of ordinary skill in the art will appreciate that the model files, external data files and computer programs are illustrative data sources and the persistent data sources may include any other types of files and code.

Users may handle or access the model workspace 124 and the persistent data sources 310 using the interfaces 340. The interfaces 340 may include, for example, command line interfaces (CLIs) 350 and graphical user interfaces (GUIs) 360. The interfaces 340 may enable users to modify data objects in the mode workspace. The interfaces 340 may also enable users to load data into the model workspace or to clear and/or reinitialize the model workspace from some persistent data source 310. The interfaces 340 may further enable users to execute the computer programs to initialize the model workspace. Using the interface 340, the model workspace 124 can be reinitialized from other data sources than the data source that currently initializes the model workspace 123. In addition, the data objects in the model workspace 124 can be stored into writable data sources. In particular, the data objects in the model workspace 124 can be stored into other sources than the data source that currently initializes the model workspace 123. In some embodiments of the present invention, it is possible for the model workspace to have zero data sources. The data objects in the model workspace 124 can be input, modified and removed through the interfaces 340. The interfaces 340 will be described in more detail with reference to FIGS. 6A-7C.

Figure 4:
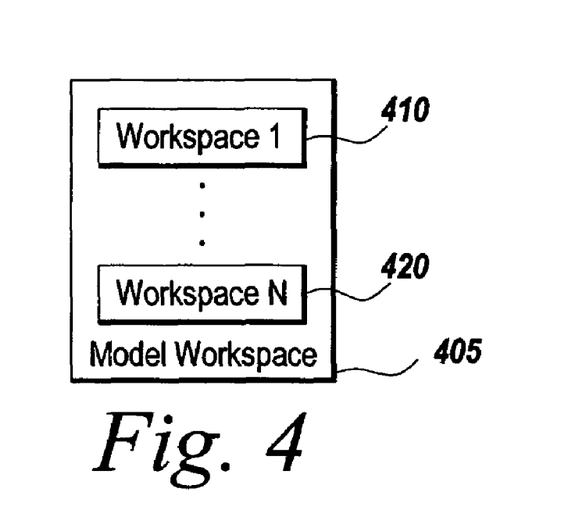
FIG. 4 shows an exemplary model workspace that may include multiple workspaces.

FIG. 4 shows an exemplary model workspace 405 that may include multiple workspaces 410 and 420. The multiple workspaces 410 and 420 may be assigned to different portions of the memory 120 to contain data objects associated with the block diagram model 123. The multiple workspaces 410 and 420 may be initialized by different data sources. For example, the multiple workspaces 410 and 420 may be initialized by a writable data source 320 and read-only data sources 330, respectively. Also, users may maintain multiple workspaces 410 and 420 via a versioning tool where the multiple workspaces 410 and 420 can be managed with version information. If the model workspace 405 includes multiple workspaces 410 and 420, one of the workspaces 410 and 420 is selected to be active with a block diagram model so that the block diagram model may access and manipulate the data objects in the active model workspace.

Figure 5:
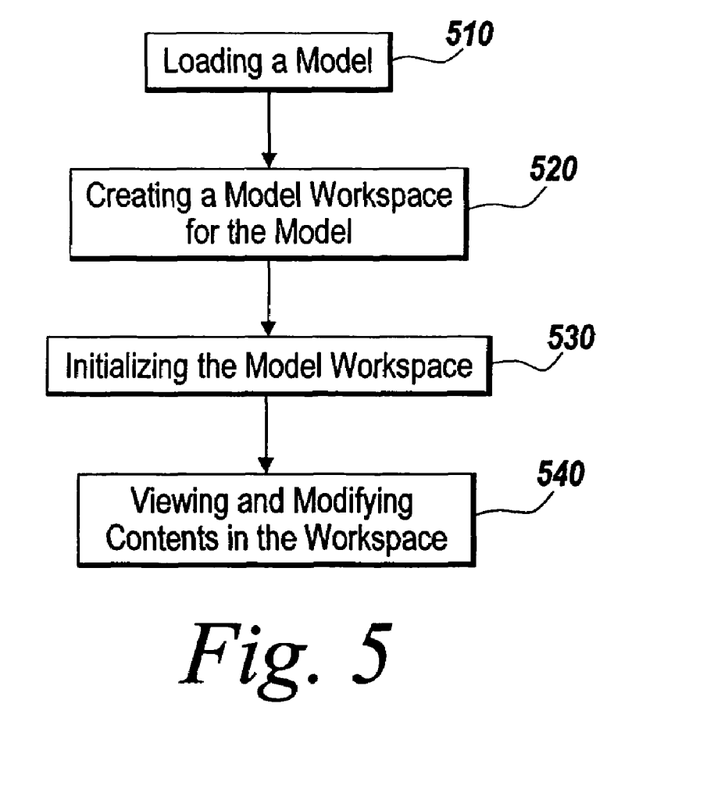
FIG. 5 is a flow chart showing an exemplary operation of a block diagram modeling environment.
Figure 6A:
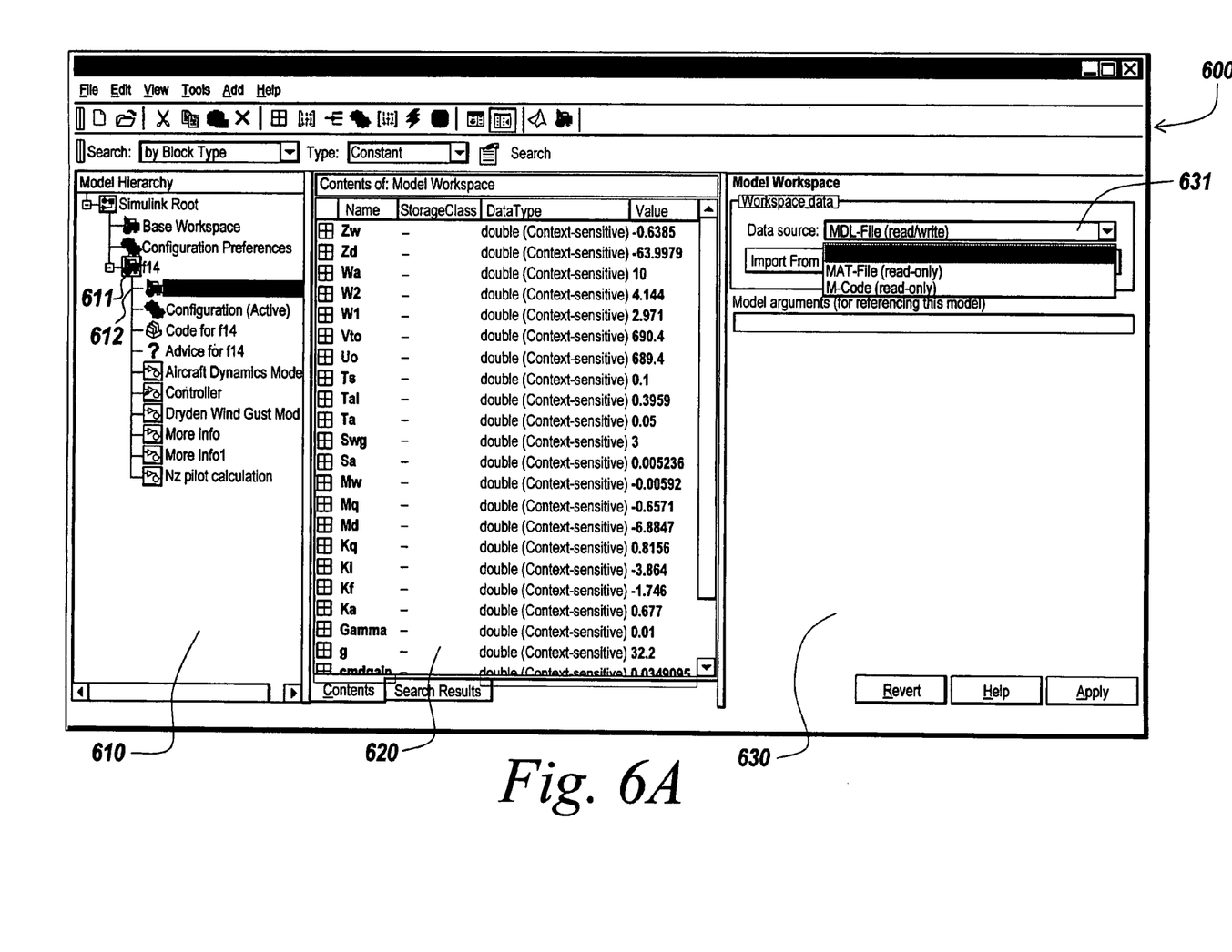
FIGS. 6A and 6B are exemplary views of user interfaces provided in the illustrative embodiment.
Figure 6B:
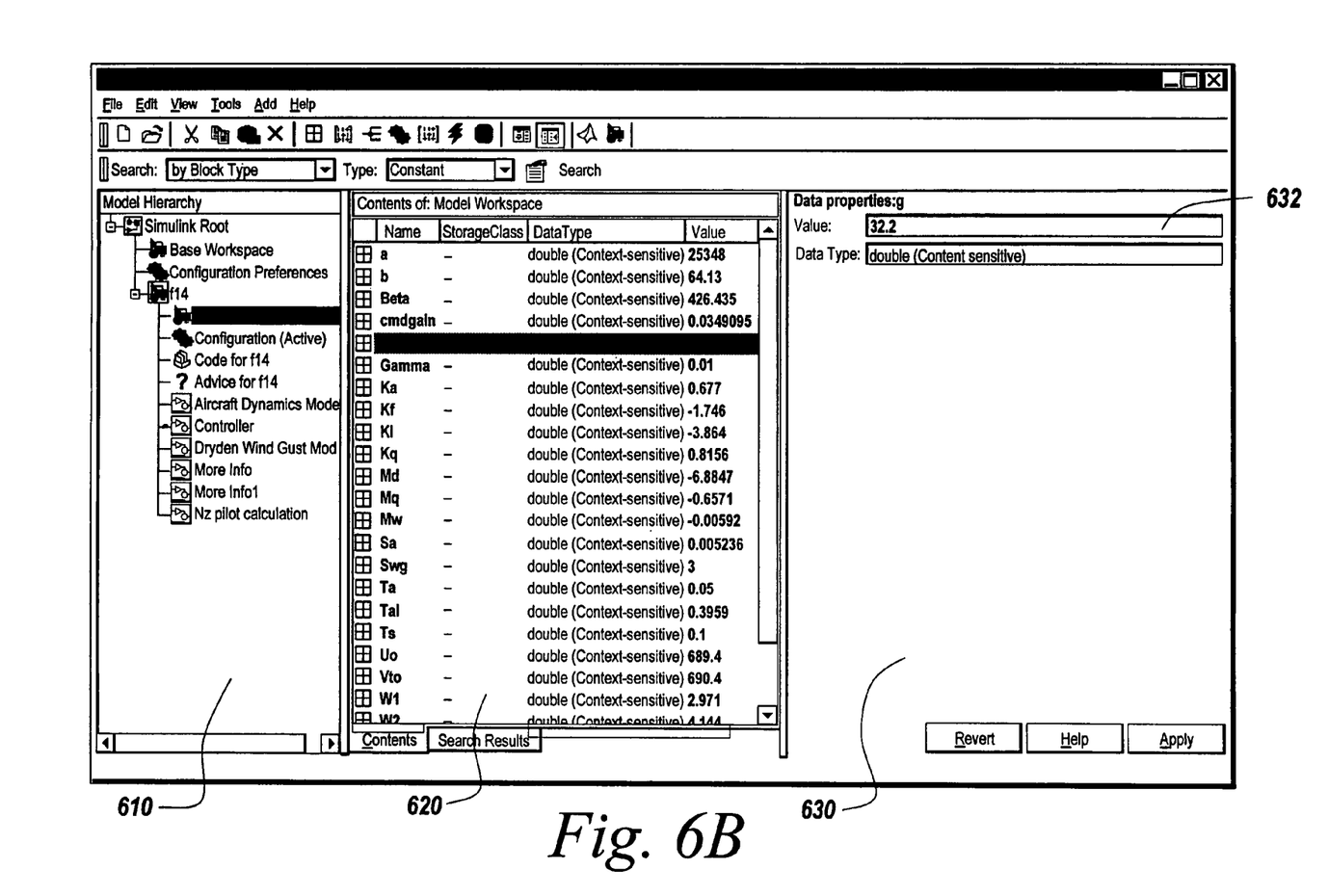

FIG. 5 is a flow chart showing an exemplary operation of a block diagram modeling environment. In the illustrative embodiment, users load a block diagram model from the storage 130 into the memory 120 (step 510). The block diagram modeling environment may provide a tool for the users to locate, view and change the elements of the model. FIG. 6A is an exemplary view of a user interface 600 provided by the tool in the illustrative embodiment. The user interface 600 includes panes 610-630. The left-hand pane 610 displays the model hierarchy of the block diagram model 123 loaded in the modeling environment. If the block diagram model 123 is loaded, the modeling environment creates a model workspace 124 for the block diagram model 123 for containing data objects associated with the block diagram model 123 (step 520). The model hierarchy pane 610 displays the model workspace 612 as an entity (node) of the model 611. The pane 610 may display other entities of the bock diagram model, such as the configuration of the block diagram model, code for the block diagram model, the subsystems of the block diagram model, etc. The model workspace is initialized by a data source selected by the users and populated with data objects provided by the selected data source (step 530). In the illustrative embodiment, there is provided an option 631 in the right-hand pane 630 for selecting a data source for initializing the model workspace. In the illustrative embodiment, the option 630 provides three data sources including MDL-file, MAT-file, and M-code. One of ordinary skill in the art will appreciate that MDL-file, MAT-file, and M-code are illustrative data sources and other type of files and code may be provided for the data sources. If the model workspace is initialized by a selected data source, the content of the model workspace can be displayed and modified (step 540). In the illustrative embodiment, the content of the model workspace can be displayed in the center pane 620. To change the value of data objects in the model workspace, the users may select a data object displayed in the center pane 620 and edit the value 632 of the data object in the right-hand pane 630, as depicted in FIG. 6B. Users can edit the value of the data object in the right-hand pane 630 or can edit the value of data attributes in the appropriate column of the center pane 620.

Figure 7A:
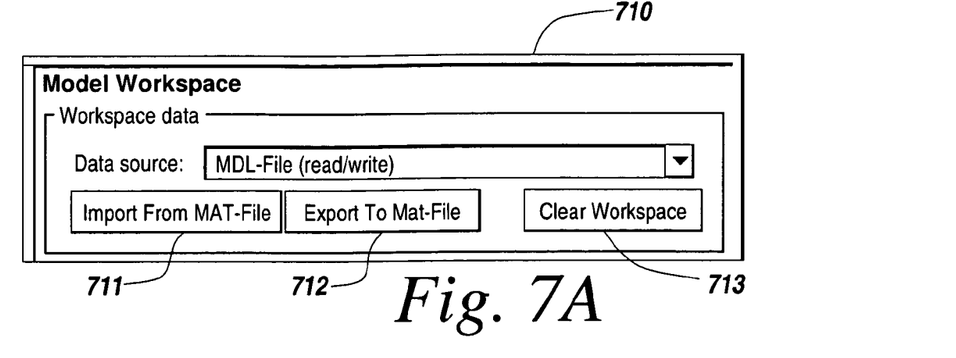
FIGS. 7A-7C depict exemplary user interfaces provided when users select one of the options for data sources of the model workspace.
Figure 7B:
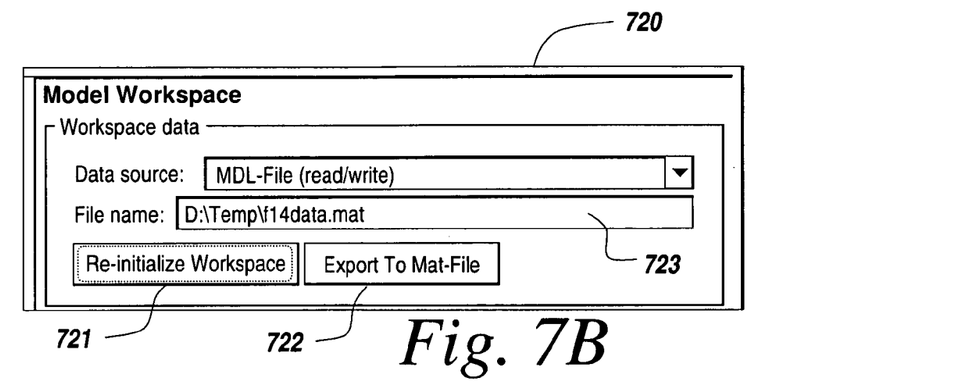
Figure 7C:
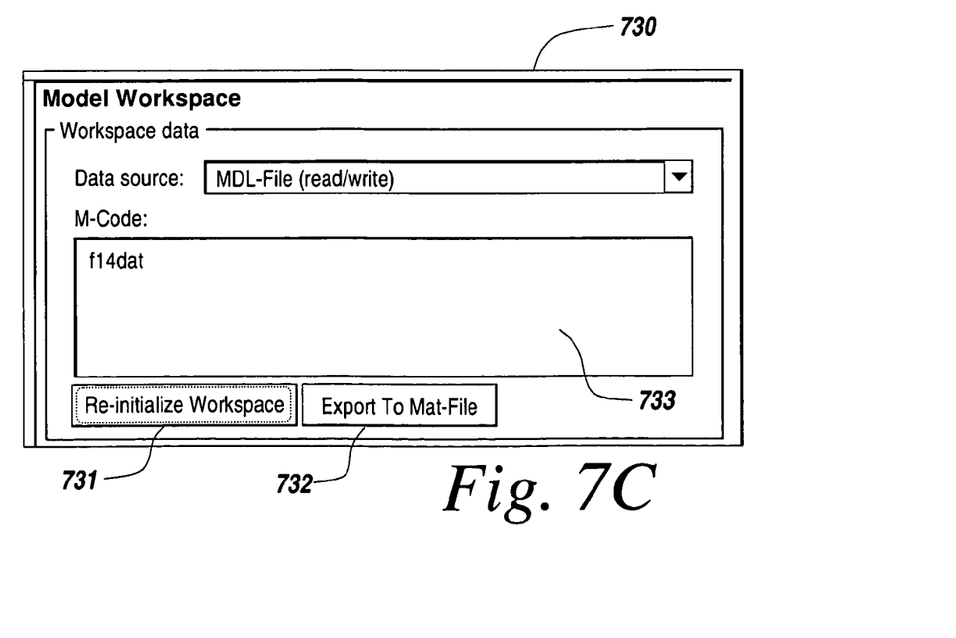
Figure 8A:
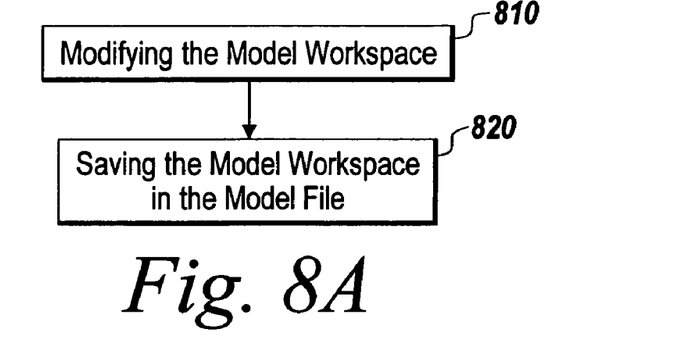
FIGS. 8A-8C are flow charts showing the exemplary operations for loading, modifying and saving data objects in the model workspace when the users select one of the for data sources of the model workspace.
Figure 8B:
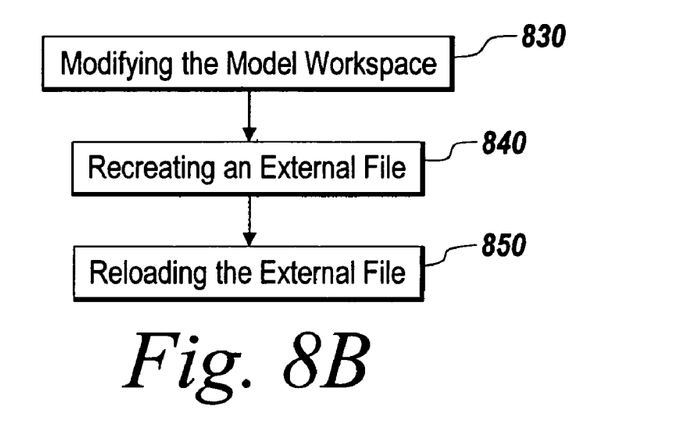
Figure 8C:
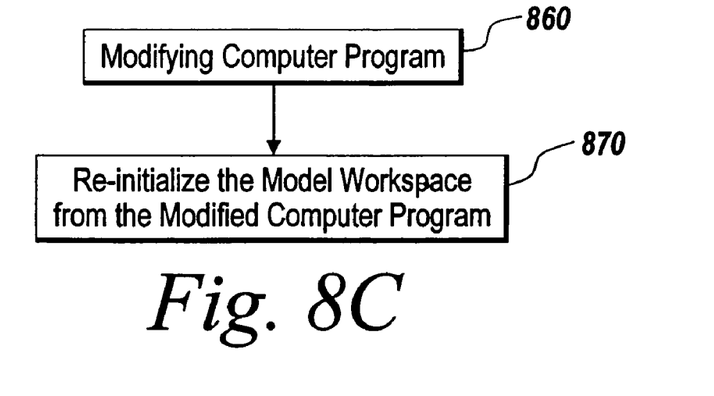

FIGS. 7A-7C depict exemplary user interfaces provided in the pane 630 when the users select one of the data sources. FIGS. 8A-8C are flow charts showing the exemplary operations for loading, modifying and saving data objects in the model workspace when the users select one of the data sources. FIG. 7A depicts an exemplary user interface 710 provided in the pane 630 when the users select an MDL-file as a data source for the model workspace. The user interface 710 provides buttons 711-713 for selecting options. The button 711 enables the users to import data objects into the model workspace from a MAT-file. The button 712 enables the users to export the data objects of the model workspace to a MAT-file. The button 713 clears all of the data objects from the model workspace. The users can use the user interface 600 or MATLAB commands to change the data objects in the model workspace (step 810 in FIG. 8A). For example, the users can create a variable in a model workspace using the user interface 600 or MATLAB commands. To change the value of a model workspace data object, the users may select the data object displayed in the center pane 620 and edit the value of the selected data object in the right pane 630, as depicted in FIG. 6B. Users may also delete the data objects from the model workspace using the user interface 600 or MATLAB commands. The changes of the data objects in the model workspace are saved in the MDL-file when users save the block diagram model in the MDL-file (step 820 in FIG. 8A).

User may also use MATLAB commands to change a model workspace. To change the model workspace, users may get the workspace for the currently selected model using the following command.

hws=get_param(bdroot, 'modelworkspace')

This command returns a handle to an object whose properties specify the source of the data used to initialize the model workspace. Users may edit the properties to change the data source using the following methods to list, set, and clear variables, evaluate expressions in, and save and reload workspaces:

whos(hws)
assignin(hws, 'varname', value)
evalin(hws, 'expression')
clear(hws)
clear(hws, 'var1', 'var2', ... )
save(hws)
reload(hws)

FIG. 7B depicts an exemplary user interface 720 provided in the pane 630 when the users select a MAT-file as a data source for the model workspace. The user interface 720 provides buttons 721 and 722 for selecting options. The button 721 enables the users to clear the model workspace and reinitialize the model workspace from a MAT file specified in the file name blank 723. The button 722 enables the users to export the data objects of the model workspace to a MAT-file. In the illustrative embodiment, to change a model workspace whose data source is a MAT-file, the users may change the data source of the model workspace temporarily to an MDL-file, and make changes of the data objects in the model workspace, as described above with reference to FIG. 7A (step 830 in FIG. 8B). Using the button 722, the users may export the changes to a MAT-file (step 840 in FIG. 8B). Users then change the data source of the model workspace back to the MAT-file and reinitialize the model workspace with the MAT-file (step 850 in FIG. 8C).

FIG. 7C depicts an exemplary user interface 730 provided in the pane 630 when the users select M-code as a data source for the model workspace. The user interface 730 provides buttons 731 and 732 for selecting options. The button 731 clears the model workspace and executes the contents of the M-code field 733. The button 732 enables the users to save the model workspace as a MAT-file. In the illustrative embodiment, to change data objects in the model workspace, users may edit the M-code in the M-code field 733 (step 860 in FIG. 8C) and execute the content of the M-code field 733 to reinitialize the model workspace (step 870 in FIG. 8C). One of ordinary skill in the art will appreciate that the embodiment of the present invention described above with reference to FIGS. 7A-7C is illustrative and the present invention may apply to other embodiments, such as an embodiment in which the content of the model workspace can be modified irrespective of the data source. In such an embodiment, changes can be saved to a writable data source (e.g., MDL-file or M-file) and users do not need to switch to MDL-file to be able to modify the content of the model workspace.

It will thus be seen that the invention attains the objectives stated in the previous description. Since certain changes may be made without departing from the scope of the present invention, it is intended that all matter contained in the above description or shown in the accompanying drawings be interpreted as illustrative and not in a literal sense. For example, the illustrative embodiment of the present invention may be practiced in any other modeling environments including textual and graphical modeling environments. Practitioners of the art will realize that the sequence of steps and architectures depicted in the figures may be altered without departing from the scope of the present invention and that the illustrations contained herein are singular examples of a multitude of possible depictions of the present invention.

We claim:

1. In an electronic device that provides a modeling environment, a method for containing data associated with a model in the modeling environment, the method comprising:

displaying, using the electronic device, a model workspace for the model that is independent of the model and exclusively associated with the model in a first user interface element;

in response to a selection of the model workspace in the first user interface element, displaying, using the electronic device, a second user interface element for providing an option for selecting a data source to initialize the model workspace, the data source being separate from the model; and storing, using the electronic device, data associated with the selected data source in the model workspace for the model.

2. The method of claim 1, wherein the workspace and contents of the model workspace are accessed via the model.

3. The method of claim 1, wherein data contained in the model workspace is only accessible to the model.

4. The method of claim 1, wherein the modeling environment includes a block diagram modeling environment.

5. The method of claim 1, further comprising:
initializing the model workspace from a data source.

6. The method of claim 5, further comprising:
reinitializing the model workspace from a different data source.

7. The method of claim 1, further comprising:
changing the data in the model workspace.

8. The method of claim 1, further comprising:
saving the data in the model workspace into a data repository.

9. The method of claim 8, further comprising:
initializing the model workspace from a first data repository; and
saving the data into a second data repository.

10. A system for controlling data associated with a model in a modeling environment, the system comprising:
a processor for providing a model workspace for containing the data associated with the model, the model workspace being independent of the model and exclusively associated with the model;
a memory for storing at least one data source for providing the model workspace with the data associated with the model, the data associated with the model being populated in the model workspace; and
a display device for:
displaying a first user interface element for displaying the model workspace, and
displaying a second user interface element for providing an option for selecting a data source to initialize the model workspace, the second user interface element being displayed in response to a selection of the model workspace in the first user interface element, the data source being separate from the model.

11. The system of claim 10, wherein the modeling environment includes a block diagram modeling environment.

12. The system of claim 10, wherein the model workspace includes multiple workspaces.

13. The system of claim 10 wherein the model workspace includes data that defines data types of variables for use with the model.

14. The system of claim 10 wherein the model workspace includes data that parameterizes the model.

15. The system of claim 10 wherein the data source includes a persistent data source.

16. The system of claim 15 wherein the persistent data source includes a model file.

17. The system of claim 15 wherein the persistent data source includes a textual or binary data file.

18. The system of claim 15 wherein the persistent data source includes a computer program that is able to be executed to initialize the model workspace.

19. The system of claim 15 wherein the persistent data source is writable so that data in the model workspace are able to be written into the persistent data source.

20. The system of claim 15 wherein the persistent data source is read-only so that changes of the data in model workspace are prevented from being written into the persistent data source.

21. The system of claim 10 wherein the data source includes at least one interface.

22. The system of claim 21 wherein the interface includes at least one of a command line interface or a graphical user interface.

23. The method of claim 21 wherein the interface enables users to create or modify the data in the model workspace.

24. In an electronic device that provides a modeling environment, a method for controlling a plurality of data sources for a model in the modeling environment, the method comprising:
displaying, using the electronic device, entities of a model in a first user interface element, the entities including a model workspace for containing data of the model; and
in response to a selection of the model workspace in the first user interface element, displaying, using the electronic device, a second user interface element for providing an option for selecting a data source to initialize the model workspace, the data source being separate from the model; and storing, using the electronic device, data from a selected data source in the model workspace for the model.

25. The method of claim 24, further comprising:
providing a model file in the option for selecting the data source, wherein the model uses the model file as a data repository and stores the data in the model workspace as a part of the model file.

26. The method of claim 24, further comprising:
providing an external data file in the option for selecting the data source, wherein the external data file stores the data from the model workspace in textual or binary code.

27. The method of claim 24, further comprising:
providing a textual computer program in the option for selecting the data source, wherein the computer program is executed to initialize the model workspace.

28. The method of claim 24, further comprising:
providing an additional option for importing data from other data sources into the workspace.

29. The method of claim 24, further comprising:
providing an additional option for exporting data from the workspace to other data repositories.

30. The method of claim 24, further comprising:
providing an additional option for clearing the data in the model workspace.

31. The method of claim 24, further comprising:
providing an additional option for reinitializing the model workspace from the persistent data source.

32. The method of claim 24, further comprising:
providing an additional option for initializing the model workspace from other data sources.

33. A computer readable storage medium storing instructions, executable in a computer for executing a method for controlling data associated with a model in a modeling environment, the instructions comprising one or more instructions for:
providing a model workspace for the model that is independent of the model and exclusively associated with the model in a first user interface element;
in response to a selection of the model workspace in the first user interface element, displaying a second user interface element for providing an option for selecting a data source to initialize the model workspace, the data source being separate from the model; and
storing data associated with the selected data source in the model workspace for the model.

34. The computer readable storage medium of claim 33, wherein the modeling environment includes a block diagram modeling environment.

35. The computer readable storage medium of claim 33, further holding instructions comprising:
instructions for initializing the model workspace from a data source.

36. The computer readable storage medium of claim 35, further holding instructions comprising:

instructions for reinitializing the model workspace from a different data source.

37. The computer readable storage medium of claim 33, further holding instructions comprising:
   instructions for changing the data in the model workspace.

38. The computer readable storage medium of claim 33, further holding instructions comprising:
   instructions for saving the data in the model workspace into a data source.

39. The computer readable storage medium of claim 38, further comprising:
   initializing the model workspace from a first data repository; and
   saving the data into a second data repository.

40. A computer readable storage medium storing instructions, executable in a computer, for controlling a plurality of data sources for a model in the modeling environment, the instructions comprising one or more instructions for:
   displaying entities of a model in a first user interface element, the entities including a model workspace for containing data of the model; and
   in response to a selection of the model workspace in the first user interface element, displaying a second user interface element for providing an option for selecting a data source to initialize the model workspace, the data source being separate from the model; and storing, using an electronic device, data from a selected data source in the model workspace for the model.

41. The computer readable storage medium of claim 40, further holding instructions comprising:
   instructions for providing a model file in the option for selecting the data source, wherein the model file stores the data source as a part of the model.

42. The computer readable storage medium of claim 40, further holding instructions comprising:
   instructions for providing an external data file in the option for selecting the data source, wherein the external data file stores the data source in textual or binary code.

43. The computer readable storage medium of claim 40, further holding instructions comprising:
   instructions for providing a textual computer program in the option for selecting the data source, wherein the computer program is executed to initialize the model workspace.

44. The computer readable storage medium of claim 40, further holding instructions comprising:
   instructions for providing an additional option for importing data from other data sources.

45. The computer readable storage medium of claim 40, further holding instructions comprising:
   instructions for providing an additional option for exporting data to other data sources.

46. The computer readable storage medium of claim 40, further holding instructions comprising:
   instructions for providing an additional option for clearing the data in the model workspace.

47. The computer readable storage medium of claim 40, further holding instructions comprising:
   instructions for providing an additional option for reinitializing the model workspace from other data sources.

\* \* \* \* \*